(12) United States Patent
Cho et al.

(10) Patent No.: US 12,444,590 B2
(45) Date of Patent: Oct. 14, 2025

(54) PLASMA SENSOR MODULE

(71) Applicant: Samsung Electronics Co., Ltd., Suwon-si (KR)

(72) Inventors: Sungwon Cho, Suwon-si (KR); Dohoon Kwon, Suwon-si (KR); Kyunghyun Kim, Suwon-si (KR); Dougyong Sung, Suwon-si (KR); Jungmo Yang, Suwon-si (KR); Younseon Wang, Suwon-si (KR); Younsok Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 315 days.

(21) Appl. No.: 18/188,540

(22) Filed: Mar. 23, 2023

(65) Prior Publication Data

US 2024/0071737 A1    Feb. 29, 2024

(30) Foreign Application Priority Data

Aug. 30, 2022  (KR) .......................... 10-2022-0109055

(51) Int. Cl.
*H01J 37/32* (2006.01)
*G01N 9/00* (2006.01)

(52) U.S. Cl.
CPC .......... *H01J 37/32917* (2013.01); *G01N 9/00* (2013.01); *H01J 2237/24585* (2013.01)

(58) Field of Classification Search
CPC ....... H01J 37/32917; H01J 2237/24585; H01J 37/32935; G01N 9/00; H05H 1/0018
See application file for complete search history.

(56) References Cited

U.S. PATENT DOCUMENTS

| 9,005,461 B2 | 4/2015 | Tatsumi et al. |
| 2004/0007326 A1* | 1/2004 | Roche ............... H01J 37/32935 |
| | | 118/712 |
| 2005/0011611 A1 | 1/2005 | Mahoney et al. |
| 2008/0084650 A1* | 4/2008 | Balasubramanian ........ |
| | | H01J 37/32431 |
| | | 361/234 |
| 2017/0194232 A1* | 7/2017 | Lin ................... H01L 21/76832 |
| 2021/0027993 A1* | 1/2021 | Kim .................. H01J 37/32119 |
| 2021/0074517 A1* | 3/2021 | Ikeda .................. C23C 16/4405 |

(Continued)

FOREIGN PATENT DOCUMENTS

| JP | 2012243844 A | 12/2012 |
| KR | 101917832 B1 | 11/2018 |

(Continued)

*Primary Examiner* — Lee E Rodak
*Assistant Examiner* — Zannatul Ferdous
(74) *Attorney, Agent, or Firm* — Wolf, Greenfield & Sacks, P.C.

(57) ABSTRACT

A plasma sensor module may include an upper substrate, a lower substrate, at least one probe and a printed circuit board (PCB). The upper substrate may be configured to be exposed to plasma. The lower substrate may contact a lower surface of the upper substrate. The lower substrate may have a thickness that is thicker than a thickness of the upper substrate. The probe may be in the lower substrate. The PCB may be in the lower substrate. The PCB may be configured to apply an alternating current to the probe to detect a density of the plasma. Thus, the structural strength of the plasma sensor module may have improved structural strength.

20 Claims, 4 Drawing Sheets

(56) References Cited

U.S. PATENT DOCUMENTS

2021/0375699 A1* 12/2021 Bae .................... H01L 22/12
2023/0307516 A1* 9/2023 Sugimoto ........... H01L 23/4824

FOREIGN PATENT DOCUMENTS

| KR | 101950884 B1 | 2/2019 |
| KR | 102056085 B1 | 12/2019 |
| KR | 20210117828 A | 9/2021 |
| KR | 20220058152 A | 5/2022 |

* cited by examiner

PLASMA SENSOR MODULE

CROSS-RELATED APPLICATION

This application claims priority under 35 USC § 119 to Korean Patent Application No. 10-2022-0109055, filed on Aug. 30, 2022 in the Korean Intellectual Property Office (KIPO), the contents of which are herein incorporated by reference in their entirety.

BACKGROUND

1. Field

Example embodiments relate to a plasma sensor module. More particularly, example embodiments relate to a plasma sensor module including an upper substrate and a lower substrate.

2. Description of the Related Art

Generally, a semiconductor fabrication process may require a narrow monitor of a process condition and operation state. For example, to improve a yield of a semiconductor device, an accurate monitoring may be required with controls of temperatures, states of gas injections, states of pressures of a chamber, a wafer, etc., a plasma density, an exposure distance, etc. Particularly, when an error related to the process condition such as a temperature, plasma, a pressure, a flux, a gas, etc., is generated, a great amount of abnormal semiconductor devices may be generated to decrease the yield.

According to related arts, a sensor on wafer (SOW) type plasma sensor module may be configured to sense the plasma density. The SOW type plasma sensor module may include a plasma sensor on a test wafer. The plasma sensor may directly sense the plasma density in the chamber of the semiconductor fabrication process.

However, the SOW type plasma sensor module may include two wafers attached to each other. Each of the two wafers may include structures such as probes, a printed circuit board having the plasma sensor, cavities configured to receive batteries, etc. The cavities may weaken structural strength of the wafers. When the weak wafers may be broken, particles may be generated from the broken wafers to contaminate semiconductor fabrication equipment.

SUMMARY

Example embodiments provide a plasma sensor module having improved structural strength.

According to example embodiments a plasma sensor module may include an upper substrate, a lower substrate, at least one probe and a printed circuit board (PCB). The upper substrate may be configured to be exposed to plasma. The lower substrate may contact a lower surface of the upper substrate. The lower substrate may have a thickness that is thicker than a thickness of the upper substrate. The probe may be in the lower substrate. The PCB may be in the lower substrate. The PCB may be configured to apply an alternating current to the probe to detect a density of the plasma.

According to example embodiments, a plasma sensor module may include an upper substrate, a lower substrate, a plurality of probes, a printed circuit board (PCB) and at least one battery. The upper substrate may be configured to be exposed to plasma. The lower substrate may be configured to contact a lower surface of the upper substrate. The lower substrate may have a thickness that is thicker than a thickness of the upper substrate. The plurality of probes may be in the lower substrate. The PCB may be in the lower substrate. The PCB may be configured to apply an alternating current to the probe to detect a density of the plasma. The battery may be in the lower substrate and configured to supply power to the PCB.

According to example embodiments, a plasma sensor module may include an upper substrate, a protection layer, a lower substrate, a plurality of probes, a PCB and at least one battery. The upper substrate may be configured to be exposed to plasma. The protection layer may be arranged on a surface of the upper substrate. The lower substrate may be configured to contact a lower surface of the upper substrate. The lower substrate may have a thickness thicker than a thickness of the upper substrate. The probes may be arranged in the lower substrate. The PCB may be arranged in the lower substrate. The PCB may be configured to apply an alternating current to at least one of the plurality of probes to detect a density of the plasma. The battery may be arranged in at least one battery in the lower substrate configured to supply power to the PCB. The lower substrate may include a first cavity at an upper surface of the lower substrate and configured to receive at least one of the plurality of probes, a second cavity at the upper surface of the lower substrate and configured to receive the PCB, and a third cavity at the upper surface of the lower substrate and configured to receive the battery. The upper substrate may have a resistance higher than a resistance of the lower substrate.

According to example embodiments, the probe, the PCB and the battery may be in the lower substrate, which has a thickness that is thicker than the thickness of the upper substrate so that the plasma sensor module may have improved structural strength. That is, the density of the plasma may be detected two-dimensionally using the uniformly arranged probes without formations of structures such as a cavity, a hole, etc., at the upper substrate. Thus, any processing of the upper substrate having the thin thickness may not be required. In contrast, processing may be concentrated on the lower substrate having the thick thickness. As a result, the structural strength of the plasma sensor module may be reinforced.

Further, the upper substrate and the lower substrate may be directly bonded to each other by the direct bonding process without an adhesive to reduce or prevent a difference between thermal coefficients, which may be caused by the adhesive, from being generated. As a result, the plasma sensor module having the thin thickness may have the strong strength to reduce damage of the plasma sensor module.

BRIEF DESCRIPTION OF THE DRAWINGS

Example embodiments will be more clearly understood from the following detailed description taken in conjunction with the accompanying drawings.

FIG. 1 is a perspective view illustrating a plasma sensor module in accordance with example embodiments;

FIG. 2 is a cross-sectional view illustrating the plasma sensor module in FIG. 1;

FIG. 3 is a plan view illustrating a lower substrate of the plasma sensor module in FIG. 2;

FIG. 4 is an enlarged cross-sectional view illustrating a probe of the plasma sensor module in FIG. 2;

FIG. 5 is a plan view illustrating the probe in FIG. 4; and

FIGS. 6 to 8 are cross-sectional views illustrating a method of manufacturing the plasma sensor module in FIG. 2.

DETAILED DESCRIPTION OF THE EMBODIMENTS

Hereinafter, example embodiments will be explained in detail with reference to the accompanying drawings.

Figure 1:
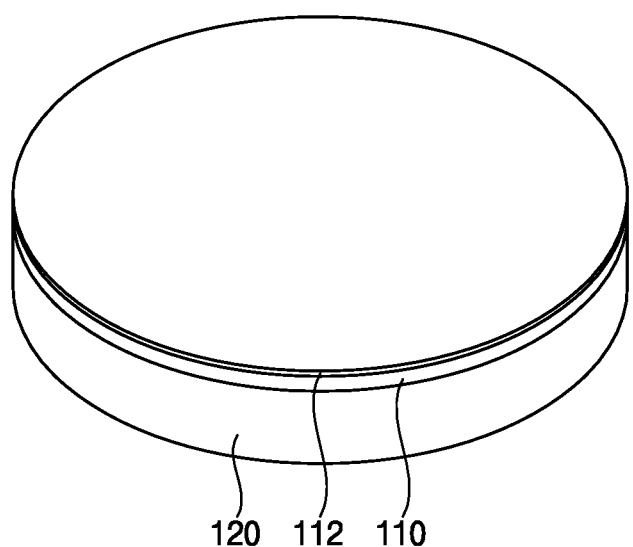
FIGS. 1 to 8 represent non-limiting, example embodiments as described herein.
Figure 2:
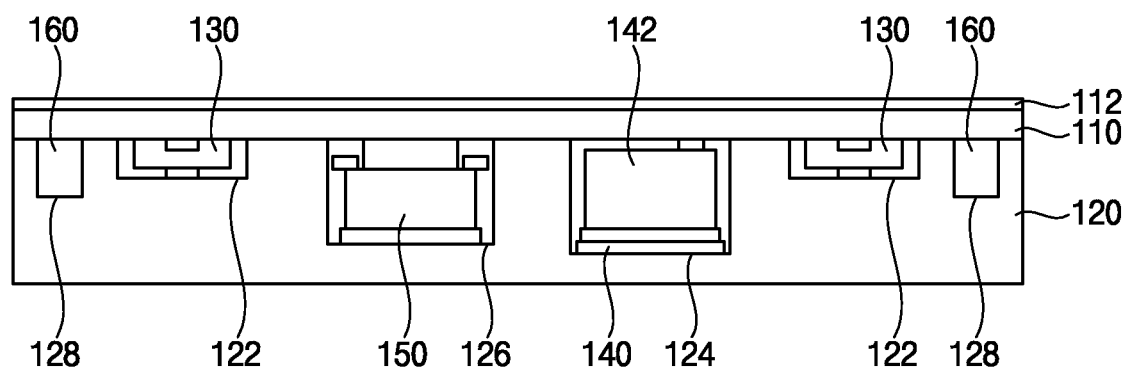
Figure 3:
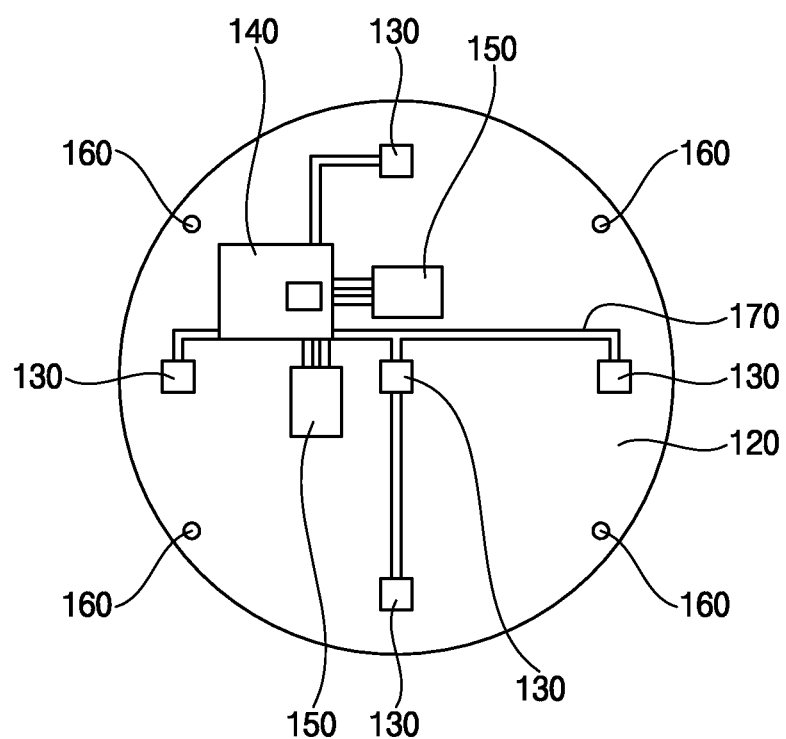
Figure 4:
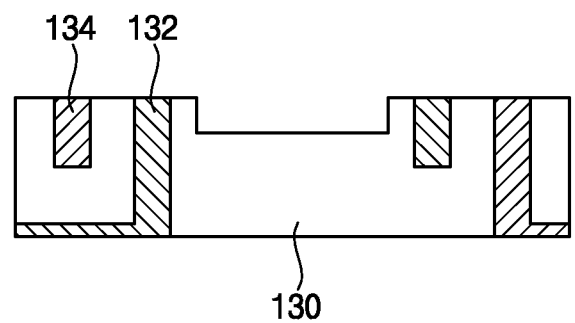
Figure 5:
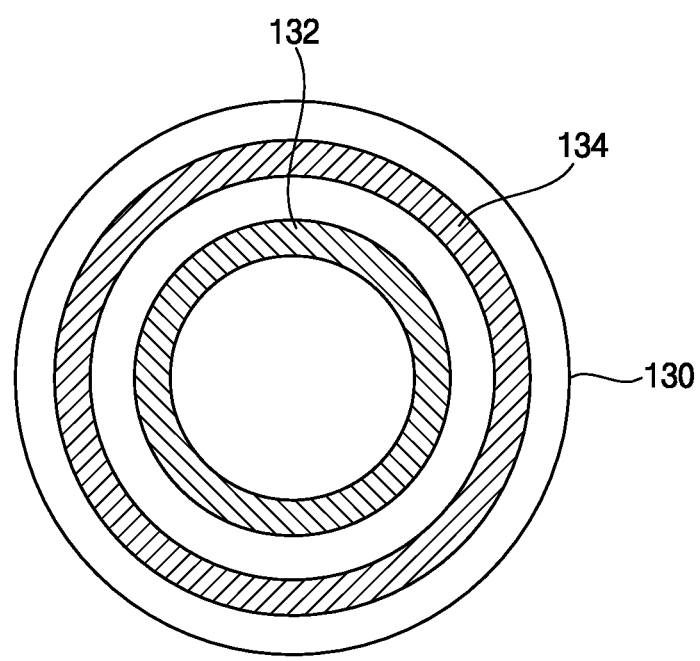

FIG. 1 is a perspective view illustrating a plasma sensor module in accordance with example embodiments, FIG. 2 is a cross-sectional view illustrating the plasma sensor module in FIG. 1, FIG. 3 is a plan view illustrating a lower substrate of the plasma sensor module in FIG. 2, FIG. 4 is an enlarged cross-sectional view illustrating a probe of the plasma sensor module in FIG. 2, and FIG. 5 is a plan view illustrating the probe in FIG. 4.

Referring to FIGS. 1 to 5, a plasma sensor module of example embodiments may include an upper substrate 110, a lower substrate 120, a plurality of probes 130, a printed circuit board (PCB) 140, at least one battery 150 and a plurality of conductive vias 160.

The upper substrate 110 is configured to be exposed to plasma. The plasma may be generated over the upper substrate 110. Thus, an upper surface of the upper substrate 110 may be exposed to the plasma. The upper substrate 110 may include a circular silicon substrate, but is not limited thereto. Further, the upper substrate 110 may be doped with impurities. For example, the impurities may include boron, but are not limited thereto.

Additionally, a protection layer 112 may be formed on a surface of the upper substrate 110, particularly, the upper surface of the upper substrate 110. The protection layer 112 may protect the upper substrate 110 from the plasma. The protection layer 112 may include $Y_2O_3$, but is not limited thereto.

The lower substrate 120 may be positioned under the upper substrate 110. An upper surface of the lower substrate 120 may contact a lower surface of the upper substrate 110. The lower substrate 120 may include a circular silicon substrate, but is not limited thereto. The lower substrate 120 may have a cross-sectional area substantially the same as a cross-sectional area of the upper substrate 110, but is not limited thereto. For example, the cross-sectional area of the lower substrate 120 may be larger or smaller than the cross-sectional area of the upper substrate 110.

Further, the lower substrate 120 may be doped with impurities. The impurities may include boron, but are not limited thereto. A doping dose of the impurities in the lower substrate 120 may be greater than a doping dose of the impurities in the upper substrate 110. Because a resistance may be in inverse proportion to the doping dose of the impurities, a resistance of the upper substrate 110 may be higher than a resistance of the lower substrate 120. In example embodiments, the resistance of the upper substrate 110 may be about 50Ω to about 60Ω, but is not limited thereto. The resistance of the lower substrate 120 may be about 1Ω to about 5Ω, but is not limited thereto.

The upper substrate 110 and the lower substrate 120 may be directly bonded to each other by a direct bonding process. When the upper substrate 110 and the lower substrate 120 may include silicon, the lower surface of the upper substrate 110 and the upper surface of the lower substrate 120 may be directly bonded to each other by the direct bonding process. Thus, an adhesive may not be used for bonding the upper substrate 110 to the lower substrate 120. That is, the adhesive may not be interposed between the upper substrate 110 and the lower substrate 120.

The lower substrate 120 may include a plurality of first cavities 122, a second cavity 124, a third cavity and fourth cavities 128. The first cavities 122, the second cavity 124, the third cavity 126 and the fourth cavities 128 may be formed at the upper surface of the lower substrate 120. The first cavities 122, the second cavity 124, the third cavity 126 and the fourth cavities 128 may be downwardly formed from the upper surface of the lower substrate 120. In contrast, the upper substrate 110 may not include any cavities. That is, the cavities 122, 124, 126 and 128 may be formed at only the lower substrate 120 having a strength that is stronger than strength of the upper substrate 110. The upper substrate 110 that is devoid of any cavities may have a relatively weak strength. Thus, the plasma sensor module may have improved structural strength.

The first cavities 122 may be arranged spaced apart from each other on the upper surface of the lower substrate 120 by a uniform gap. For example, the first cavities 122 may be formed at a central portion and an edge portion of the upper surface of the lower substrate 120. The first cavities 122 at the edge portion of the upper surface of the lower substrate 120 may be spaced apart from each other by the uniform gap. In example embodiments, the first cavities at the edge portion of the upper surface of the lower substrate 120 may include four cavities spaced apart from each other by about 90°, but are not limited thereto.

The second cavity 124 may be formed at the central portion of the upper surface of the lower substrate 120. The third cavity 126 may be formed at the central portion of the upper surface of the lower substrate 120 adjacent to the second cavity 124. In example embodiments, the third cavity 126 may include two cavities, but is not limited thereto. For example, the third cavity 126 may include one cavity or at least three cavities.

The fourth cavities 128 may be formed at the edge portion of the upper surface of the lower substrate 120. Particularly, the fourth cavities 128 may be positioned between the first cavities 122. Thus, the fourth cavities 128 may include four cavities spaced apart from each other by about 90°, but are not limited thereto.

The probes 130 may be arranged in the first cavities 122. That is, the probes 130 may be in the lower substrate 120. Because the lower surface of the upper substrate 110 may contact the upper surface of the lower substrate 120, the probes 130 in the first cavities 122 may be covered by the upper substrate 110. Thus, the probes 130 may not be directly exposed to the plasma. That is, the probes 130 may be indirectly exposed to the plasma through the upper substrate 110. Further, because the first cavities 122 may be spaced apart from each other by the uniform gap, the probes 130 in the first cavities 122 may also be spaced apart from each other by the uniform gap.

The uniformly arranged probes 130 may obtain a two-dimensional density distribution of the plasma. Particularly, the density of the plasma may be two-dimensionally detected using the uniformly arranged probes 130 without formations of any structures such as a cavity, a hole, etc., at the upper substrate 110. Thus, any processing of the upper substrate 110 having the thin thickness may not be required. In contrast, processing may be concentrated on the lower substrate 120 having the thick thickness. As a result, the plasma sensor module may have the reinforced strength.

Each of the probes 130 may include an inner probing line 132 and an outer probing line 134. The inner probing line 132 may be electrically isolated from the outer probing line 134. For example, an insulation material may be interposed between the inner probing line 132 and the outer probing line 134. The outer probing line 134 may have an annular shape configured to surround the inner probing line 132, but is not limited thereto.

In example embodiments, the probe 130 may include Langmuir probe, but is not limited thereto. The Langmuir probe may change a voltage applied to the probe 130 to measure characteristics of the plasma.

The PCB 140 may be arranged in the second cavity 124. That is, the PCB 140 may be in the lower substrate 120. The PCB 140 may apply an alternating current to the probes 130 to detect the density of the plasma. Particularly, the PCB 140 may apply the alternating current to the inner probing line 132 and the outer probing line 134. For example, the PCB 140 may apply a radio frequency (RF) current to the probes 130.

The PCB 140 may include a plasma sensor 142, an electronic component, etc. The plasma sensor 142 may be electrically connected with the probes 130 through a conductive line 170 to detect the density of the plasma.

The electronic component may include a control chip, a communication chip, a memory chip, etc. The control chip may control operations of the plasma sensor 142. The communication chip may transmit information of the plasma detected by the plasma sensor 142 by a wireless communication. The memory chip may store information for controlling the operations of the plasma sensor 142. Further, the memory chip may store the information of the plasma detected by the plasma sensor 142.

The battery 150 may be arranged in the third cavity 126. That is, the battery 150 may be in the lower substrate 120. The battery 150 may supply power to the PCB 140. In example embodiments, because the third cavity 126 may include the two cavities, the battery 150 may also include two batteries, but is not limited thereto.

The conductive vias 160 may be arranged in the fourth cavities 128. That is, the conductive vias 160 may be in the lower substrate 120. Because the fourth cavities 128 may be positioned between the first cavities 122, the conductive vias 160 may also be positioned between the probes 130. The conductive vias 160 may bypass the RF current to reduce or prevent the RF current from flowing between the probes 130. The conductive vias 160 may include a metal, but are not limited thereto. For example, the conductive vias 160 may include a conductive material.

Figure 6:
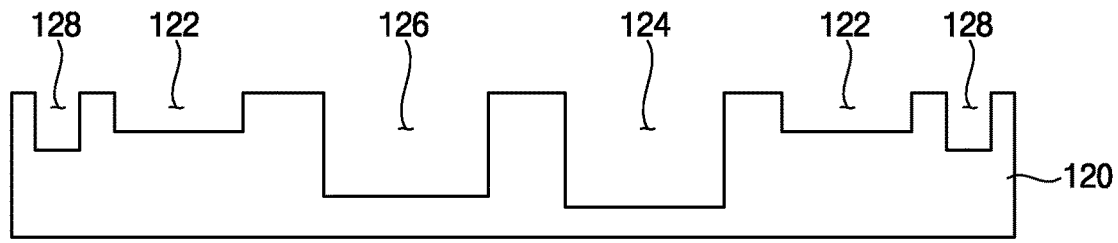
Figure 7:
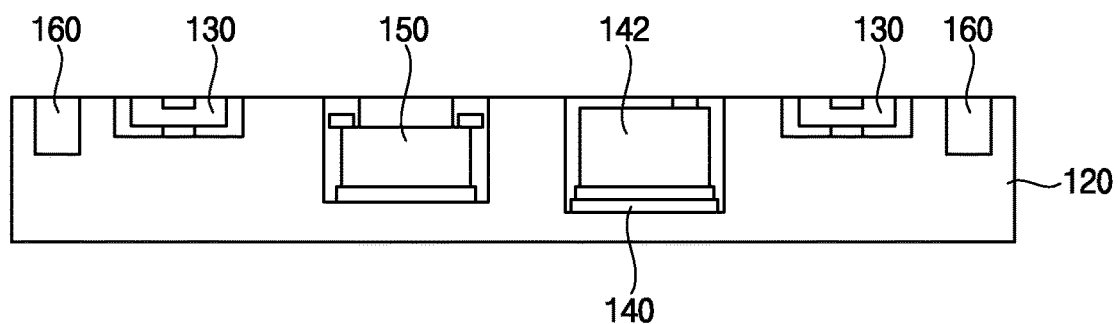
Figure 8:
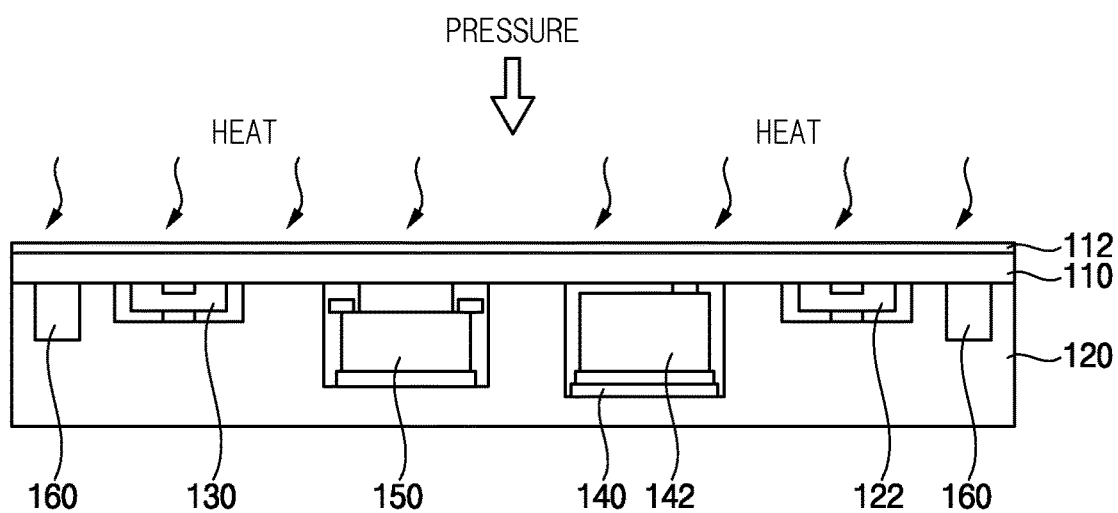

FIGS. 6 to 8 are cross-sectional views illustrating a method of manufacturing the plasma sensor module in FIG. 2.

Referring to FIG. 6, the impurities may be implanted into the lower substrate 120. The first cavities 122, the second cavity 124, the third cavities 126 and the fourth cavities 128 may be formed at the upper surface of the lower substrate 120.

Referring to FIG. 7, the probes 130 may be arranged in the first cavities 122. The PCB 140 may be arranged in the second cavity 124. The batteries 150 may be arranged in the third cavities 126. The conductive vias 160 may be arranged in the fourth cavities 128.

Referring to FIG. 8, the upper substrate 110 doped with the impurities may be arranged over the lower substrate 120. The doping dose of the impurities in the lower substrate 120 may be greater than the doping dose of the impurities in the upper substrate 110. Further, the protection layer 112 may be formed on the upper surface of the upper substrate 110.

The silicon direct bonding process may be performed to directly bond the upper substrate 110 to the lower substrate 120 to complete the plasma sensor module in FIG. 2. In example embodiments, the upper substrate 110 and the lower substrate 120 may be directly bonded to each other without the adhesive.

The silicon direct bonding process may include applying heat and a pressure to the upper surface of the upper substrate 110 to direct bond the upper substrate 110 to the lower substrate 120. The silicon direct bonding process may include a dangling process and an annealing process. The dangling process may include contacting the lower surface of the upper substrate 110 with the upper surface of the lower substrate 120 to dangling-bond the silicon in the lower substrate 120 with the silicon in the upper substrate 110. The annealing process may include applying the heat to the lower substrate 120 and the upper substrate 110 to covalent bond the upper substrate 110 with the lower substrate 120 by expanding the lower substrate 120 and the upper substrate 110.

According to example embodiments, the probe, the PCB and the battery may be arranged in the lower substrate having the thickness thicker than the thickness of the upper substrate so that the plasma sensor module may have improved structural strength. That is, the density of the plasma may be two-dimensionally detected using the uniformly arranged probes without formations of structures such as a cavity, a hole, etc., at the upper substrate. Thus, any processing of the upper substrate 110 having the thin thickness may not be required. In contrast, processing may be concentrated on the lower substrate 120 having the thick thickness. As a result, the structural strength of the plasma sensor module may be reinforced.

Further, the upper substrate and the lower substrate may be directly bonded to each other by the direct bonding process without an adhesive to reduce or prevent a difference between thermal coefficients, which may be caused by the adhesive, from being generated. As a result, the plasma sensor module having the thin thickness may have the strong strength to reduce damage of the plasma sensor module.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures.

What is claimed is:
1. A plasma sensor module comprising:
   an upper substrate that is configured to be exposed to plasma;
   a lower substrate configured to contact a lower surface of the upper substrate, the lower substrate having a thickness that is thicker than a thickness of the upper substrate;
   at least one probe in the lower substrate; and
   a printed circuit board (PCB) in the lower substrate, wherein the PCB is configured to apply an alternating current to the at least one probe to detect a density of the plasma, the at least one probe is below an upper- most surface of the lower substrate, and a lower surface of the upper substrate is entirely planar.

2. The plasma sensor module of claim 1, further comprising a protection layer on a surface of the upper substrate.

3. The plasma sensor module of claim 2, wherein the protection layer comprises $Y_2O_3$.

4. The plasma sensor module of claim 1, wherein the lower substrate comprises:
a first cavity at an upper surface of the lower substrate that is configured to receive the at least one probe; and
a second cavity at the upper surface of the lower substrate that is configured to receive the PCB.

5. The plasma sensor module of claim 1, wherein the upper substrate has a resistance that is higher than a resistance of the lower substrate.

6. The plasma sensor module of claim 1, wherein the upper substrate and the lower substrate are bonded to each other by a direct bonding process.

7. The plasma sensor module of claim 1, wherein the at least one probe comprises a plurality of probes.

8. The plasma sensor module of claim 7, further comprising at least one conductive via in the lower substrate that is configured to bypass the alternating current between the plurality of probes.

9. The plasma sensor module of claim 1, wherein the PCB comprises a plasma sensor configured to measure the density of the plasma.

10. The plasma sensor module of claim 1, further comprising at least one battery in the lower substrate configured to supply power to the PCB.

11. The plasma sensor module of claim 10, wherein the lower substrate comprises a third cavity at an upper surface of the lower substrate that is configured to receive the battery.

12. A plasma sensor module comprising:
an upper substrate that is configured to be exposed to plasma;
a protection layer on a surface of the upper substrate;
a lower substrate configured to contact a lower surface of the upper substrate, the lower substrate having a thickness that is thicker than a thickness of the upper substrate;
a plurality of probes in the lower substrate;
a printed circuit board (PCB) in the lower substrate, wherein the PCB is configured to apply an alternating current to at least one of the plurality of probes to detect a density of the plasma; and
at least one battery in the lower substrate configured to supply power to the PCB, the plurality of probes is below an uppermost surface of the lower substrate, and a lower surface of the upper substrate is entirely planar.

13. The plasma sensor module of claim 12, wherein the lower substrate comprises:
a first cavity at an upper surface of the lower substrate and configured to receive at least one of the plurality of probes;
a second cavity at the upper surface of the lower substrate and configured to receive the PCB; and
a third cavity at the upper surface of the lower substrate and configured to receive the battery.

14. The plasma sensor module of claim 12, wherein the upper substrate has a resistance that is higher than a resistance of the lower substrate.

15. The plasma sensor module of claim 12, further comprising a plurality of conductive vias in the lower substrate that are configured to bypass the alternating current between the plurality of probes.

16. The plasma sensor module of claim 12, wherein the PCB comprises a plasma sensor configured to measure the density of the plasma.

17. A plasma sensor module comprising:
an upper substrate that is configured to be exposed to plasma;
a protection layer on a surface of the upper substrate;
a lower substrate configured to contact a lower surface of the upper substrate, the lower substrate having a thickness that is thicker than a thickness of the upper substrate;
a plurality of probes in the lower substrate;
a printed circuit board (PCB) in the lower substrate, wherein the PCB is configured to apply an alternating current to at least one of the plurality of probes to detect a density of the plasma; and
at least one battery in the lower substrate configured to supply power to the PCB,
wherein the lower substrate comprises:
a first cavity at an upper surface of the lower substrate and configured to receive at least one of the plurality of probes;
a second cavity at the upper surface of the lower substrate and configured to receive the PCB; and
a third cavity at the upper surface of the lower substrate and configured to receive the battery, and
wherein the upper substrate has a resistance that is higher than a resistance of the lower substrate, the plurality of probes is below an uppermost surface of the lower substrate, and a lower surface of the upper substrate is entirely planar.

18. The plasma sensor module of claim 17, wherein the lower substrate further comprises a fourth cavity at the upper surface of the lower substrate to receive a conductive via, which is configured to bypass an alternating current between the plurality of probes, in the fourth cavity.

19. The plasma sensor module of claim 17, further comprising a protection layer on the upper substrate.

20. The plasma sensor module of claim 17, wherein the lower substrate has a doping dose of impurities higher than a doping dose of impurities in the upper substrate to provide the upper substrate with a resistance that is higher than a resistance of the lower substrate.

* * * * *